United States Patent [19]
Platzer et al.

[11] Patent Number: 5,374,184
[45] Date of Patent: Dec. 20, 1994

[54] PHOTOPOLYMERIZABLE MATERIAL AND PROCESS FOR THE PRODUCTION OF A COLORED IMAGE

[75] Inventors: Stephan J. W. Platzer, Califon, N.J.; Gerhard Buhr, Koenigstein, Germany; Manfred Michel; Andrea Buchmann, both of Weisbaden, Germany

[73] Assignee: Hoeschst Aktiengesellschaft, Frankfurt am Main, Germany

[21] Appl. No.: 222,393

[22] Filed: Apr. 4, 1994

[30] Foreign Application Priority Data

Apr. 10, 1993 [DE] Germany .................. 4311949

[51] Int. Cl.$^5$ .............................. G03C 11/12
[52] U.S. Cl. ........................ 430/262; 430/253; 430/254; 430/258; 430/259; 430/260; 430/263
[58] Field of Search .............. 430/253, 254, 258, 259, 430/260, 262, 263

[56] References Cited

U.S. PATENT DOCUMENTS

| | | | |
|---|---|---|---|
| 3,615,435 | 10/1971 | Chu | 430/253 |
| 4,288,525 | 9/1981 | Shepherd et al. | 430/253 |
| 4,692,395 | 9/1987 | Findlay | 430/254 |
| 4,766,053 | 8/1988 | Shinozaki et al. | 430/263 |
| 4,895,787 | 1/1990 | Platzer | 430/253 |
| 5,001,036 | 3/1991 | Choi | 430/263 |
| 5,049,476 | 9/1991 | Platzer | 430/253 |
| 5,248,583 | 9/1993 | Lundquist et al. | 430/263 |
| 5,292,613 | 3/1994 | Sato et al. | 430/263 |
| 5,300,399 | 4/1994 | Wilczak | 430/260 |

FOREIGN PATENT DOCUMENTS 0514186 11/1992 European Pat. Off. .

OTHER PUBLICATIONS

Research Disclosure, BD.222, Oct. 1982, Havant GB Seiten 328–329, D. D'Hondt et al. "Photodelamination Imaging".
Photographic Science and Engineering, Bd.22, Nr. 3, 1978, 1978, Washington US Seiten 138–141, T. Nakayama et al. "Photodelamination Imaging—A New Approach in Dry Processing".

*Primary Examiner*—Hoa Van Le
*Attorney, Agent, or Firm*—Foley & Lardner

[57] ABSTRACT

A photopolymerizable material having
(A) a flexible, transparent film support;
(B) a colored, polymerizable layer containing an organic binder, a free-radical-polymerizable compound, containing at least one terminal ethylenically unsaturated group, and a dye or colored pigment;
(C) an adhesion layer containing a thermoplastic polymer and having a $T_g$ of from 25° to 100° C.; and
(D) an uncolored photopolymerizable layer which contains a polymeric organic binder, a free-radical-polymerizable compound containing at least one terminal ethylenically unsaturated group and a photopolymerization initiator between the film support (A) and the colored polymerizable layer (B), where the cohesion of layers (B), (C) and (D) and the adhesion of these layers to one another and to the film support (A) provides the relationship wherein the adhesion ($a_2$) of the photopolymerizable layer (D) to the colored layer (B) in the unexposed state is lower than: (i) the adhesion ($a_3$) of the colored layer (B) to the adhesion layer (C); (ii) the adhesion ($a_1$) of the photopolymerizable layer (D) to the film support (A); and (iii) the cohesion ($c_1$), ($c_2$) and ($c_3$) of layers (D), (B) and (C) and the adhesion ($a_3'$) of the colored layer (B) to the adhesion layer (C) in the exposed state is lower than: (i) the adhesion ($a_1'$) of the photopolymerized layer (D) to the film support (A); (ii) the adhesion ($a_2'$) of the photopolymerized layer (D) to the colored layer (B); and (iii) than the cohesion ($c_1'$), ($c_2'$) and ($c_3'$) of layers (D) , (B) and (C). The material is processed by "peel-apart" development and yields color images with lower background discoloration.

20 Claims, 1 Drawing Sheet

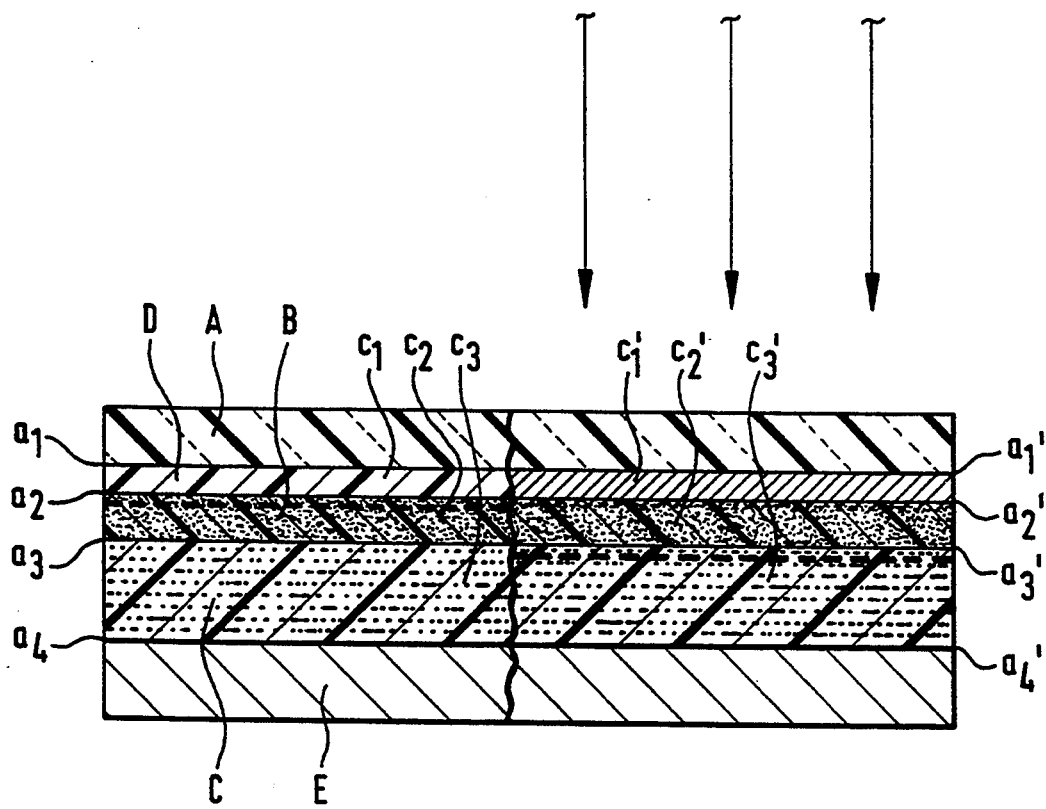

PHOTOPOLYMERIZABLE MATERIAL AND PROCESS FOR THE PRODUCTION OF A COLORED IMAGE

BACKGROUND OF THE INVENTION

1. Field of the Invention

The invention relates to a photopolymerizable material that is suitable for the production of colored images, in particular, for color proofing for multicolor printing. The invention further relates to a process for the production of a colored image, in particular, a color proofing method in which a photopolymerizable material comprising a transparent film support, a colored polymerizable layer and a thermoplastic adhesion layer is laminated onto an image-receiving sheet, exposed imagewise through the film support and developed to produce the image by peeling off the film support together with the exposed areas of the colored polymerizable layer.

2. Description of Related Art

Materials and processes relating to color proofing are known and are described, for example, in U.S. Pat. Nos. 4,895,787 and 5,049,476, the disclosures of which are incorporated herein by reference in their entirety. The color proofing process described therein has the advantage that development of the image does not require the use of any alkaline or acidic solutions or organic solvents. Color proofing materials typically include a transparent film support, a colored photopolymerizable layer and a heat-activatable adhesion layer. A disadvantage of these materials is that they produce images whose background areas have a yellow discoloration. As has been found, this discoloration is predominantly attributable to the presence of the photoinitiator in the photopolymerizable layer which can diffuse into the adhesion layer during storage.

Because this photoinitiator also is present in the image areas of the photopolymerizable layer, the color of each individual color image is distorted by its presence. Although attempts have been made to employ photoinitiators whose absorption is exclusively in the ultra-violet region and which therefore appear colorless in the visible region, these photoinitiators are significantly less effective in the light of conventional copying lamps and require very long exposure times. It also has been found that even visually colorless photoinitiators can cause a color shift, since these compounds frequently form colored photodecomposition products.

U.S. Pat. No. 3,615,435 describes a process for the production of colored images in which a photosensitive material comprising a layer support, an uncolored photopolymerizable layer, a colored photopolymerizable layer and an image-receiving sheet is exposed imagewise and developed to produce an image by peeling apart the layer support and the image receiving sheet. The unexposed areas of the colored photopolymerizable layer remain on the image-receiving sheet, while the exposed areas remain on the layer support. Using this method, single-color images are obtained. The production of multicolored images from superimposed single-color images also is described, however, development is always carried out by washing out. A color shift also occurs in this material since the colored photopolymerizable layer contains a photoinitiator.

U.S. Pat. No. 4,288,525 describes a photosensitive material which contains an uncolored photopolymerizable layer and a colored, non-photosensitive layer. The material is exposed and developed by peeling apart. The photopolymerizable layer and at least part of the colored layer remain on the layer support in the exposed areas, while both layers remain on the image-receiving material in the unexposed areas. Color distortion therefore is caused in the colored positive image by the presence of the photoinitiator in the photopolymerizable layer. A similar material and process are described in U.S. Pat. No. 4,692,395. The disclosures of the U.S. Patents described above are incorporated herein by reference in their entirety.

Thus, there exists a need to provide a material and a photopolymerizable process that produces color images that are not distorted by photoinitiator residue and that have low background discoloration.

SUMMARY OF THE INVENTION

An object of the invention is to provide a photopolymerizable material and a process for the production of colored images, in particular multicolored images, that produces pure-color images which are not distorted by photoinitiator residues which absorb in the visible spectral region. It also is an object of the invention to provide a photopolymerizable material and a process for producing a colored image that utilizes highly photosensitive photopolymerizable mixtures. It is an additional object of the invention to provide a photopolymerizable material and a process for the production of color images that have low background discoloration.

In accordance with these objectives and other objectives of the invention, there is provided a photopolymerizable material having (A) a flexible, transparent film support, (B) a colored, polymerizable layer which contains a polymeric organic binder, a free-radical-polymerizable compound, containing at least one terminal ethylenically unsaturated group, and a dye or colored pigment, and (C) an adhesion layer which contains a thermoplastic polymer and has a glass transition temperature ($T_g$) of from 25° to 100° C.

The material according to the invention also includes an uncolored photopolymerizable layer (D) which contains a polymeric organic binder, a free-radical-polymerizable compound containing at least one terminal ethylenically unsaturated group, and a photopolymerizable initiator. Uncolored photopolymerizable layer (D) is arranged between the film support (A) and the colored polymerizable layer (B), and the cohesion of layers (B), (C) and (D) and the adhesion of these layers to one another and to the film support (A) are adjusted so that the adhesion ($a_2$) of the photopolymerizable layer (D) to the colored polymerizable layer (B) in the unexposed state is lower than (i) the adhesion ($a_3$) of the colored layer (B) to the adhesion layer (C), (ii) the adhesion ($a_1$) of the photopolymerizable layer (D) to the film support (A), and (iii) the cohesion ($c_1$), ($c_2$) and ($c_3$) of layers (D), (B) and (C), respectively. The adhesion ($a_3'$) of the colored layer (B) to the adhesion layer (C) in the exposed state is lower than (i) the adhesion ($a_1'$) of the photopolymerized layer (D) to the film support (A), (ii) the adhesion ($a_2'$) of the photopolymerized layer (D) to the colored layer (B), and (iii) the cohesion ($c_1'$), ($c_2'$) and ($c_3'$) of layers (D), (B) and (C), respectively.

In accordance with the aforementioned objectives, there is provided a process for the production of a colored image which comprises (i) laminating a photopolymerizable material having the above-described features by means of its adhesion layer (C) to an image-receiving sheet (E) under pressure and an elevated temperature; (ii) exposing the resultant laminate imagewise through the film support (A); and (iii) peeling the film support, together with the photopolymerizable layer (D) and the exposed areas of the colored polymerizable layer (B), off from the image-receiving sheet. The photopolymerizable material further is characterized in that the adhesion ($a_4$) of the adhesion layer (C) to the image-receiving sheet (E) in the unexposed state is greater than the adhesion ($a_2$) of the photopolymerizable layer (D) to the colored layer (B), and the adhesion ($a_4'$) of the adhesion layer (C) to the image-receiving sheet (E) in the exposed state is greater than the adhesion ($a_3'$) of the colored polymerizable layer (B) to the adhesion layer (C).

These and other objects of the invention will become reality apparent to those skilled in the art upon review of the detailed description that follows.

BRIEF DESCRIPTION OF THE DRAWINGS

FIG. 1 illustrates a cross-section of a photopolymerizable material of the invention after lamination on an image-receiving material in the exposed and unexposed state.

DETAILED DESCRIPTION OF THE PREFERRED EMBODIMENTS

The process according to the invention preferably first is carried out for the production of a single-color image using a material which contains a colored polymerizable layer (B) in one primary color of the multi-color print and is exposed under a color separation, which corresponds to the same primary color. To prepare a multi-colored image, the process steps described above then can be repeated on the same image-receiving sheet using materials in the other primary colors, each exposure being carried out in register with the first single-color image on the receiving sheet. Those skilled in the art are familiar with the techniques involved in carrying out multiple exposure and image transfer to achieve a multicolor image.

A preferred embodiment of the inventive material is that the colored layer (B), although containing a polymerizable compound, does not contain a photoinitiator. In this arrangement, no photoinitiator diffuses out of this layer into the immediately adjacent adhesion layer. In addition, the colored image elements transferred to the image-receiving sheet contain virtually no photoinitiator which could distort their color impression. It is furthermore preferred that layer (B) contains a polymerizable compound that polymerizes, at least to same extent in the region adjacent to the photopolymerizable layer (D), on exposure through contact with the polymerizing compound layer (D), and thus increases the adhesion between the layers (B) and (D).

FIG. 1 illustrates a cross-section of a photopolymerizable material of the invention after lamination onto an image-receiving material (E). The right-hand section of the figure illustrates (indicated by vertical arrows) the material after exposure, and the left-hand portion illustrates an unexposed area. A and E represent the film support and the receiving material, respectively. Between these layers are the uncolored photopolymerizable layer (D), the colored polymerizable layer (B) and the adhesion layer (C).

Throughout this description, $c_1$ denotes the cohesion of the photopolymerizable layer (D), $c_2$ denotes the cohesion of the colored polymerizable layer (B) and $c_3$ denotes the cohesion of the adhesion layer (C). Throughout this description, cohesion denotes the forces that hold a layer together and prevent that layer from peeling apart when the substrate and image-receiving material are peeled apart. The adhesion at the various interfaces before exposure is indicated by $a_1$, $a_2$, $a_3$ and $a_4$, and the adhesion after exposure is indicated by $a_1'$, $a_2'$, $a_3'$ and $a_4'$ in the sense of the above explanations. The hatching of layer (D) and of the interface zone within layer (B) indicates the effect of the polymerization in the exposed portion of the inventive film.

Before exposure, the lowest adhesion ($a_2$) is between layers (D) and (B). The adhesions between all of the other layers and all the cohesions of the individual layers are greater than ($a_2$). The exposure shifts the position of the lowest adhesion, since, as described above, layers (D) and (B) are firmly anchored to one another by the polymerization. The lowest adhesion ($a_3'$) after exposure is between layers (B) and (C), which is again lower than each of the cohesions $c_1'$, $c_2'$ and $c_3'$ and the adhesions between the other layers. Each of the dashed lines in FIG. 1 illustrate the limiting line of lowest adhesion, i.e. The nominal breaking point when (A) and (E) are peeled apart. Although the cohesion of layer (D) and, in part, of layer (B) are also changed on exposure, this change has no effect on the position of the nominal breaking point between layers (D) and (B) before exposure, and between layers (B) and (C) after exposure.

For the purposes of this invention, an uncolored photopolymerizable layer is taken to mean a layer which has not been colored by addition of dyes or colored pigments that absorb in the visible spectral region. As stated above, the colored polymerizable layer (B) is not itself photosensitive, i.e. will not polymerize itself upon exposure. However, layer (B) can be stimulated to polymerize on exposure of the adjacent photopolymerizable layer, at least in the region of contact therewith. The layer can furthermore be cured after transfer of the image areas to the receiving sheet by intense exposure without a mask, if necessary with warming. Thus, upon exposure, the adhesion between (B) and (D) is increased significantly.

The flexible, transparent film support (A) for the material according to the invention can be any derived material, including, for example, plastic films which are dimensionally stable on warming to about 60° to about 130° C. Preferably, the films are made from polyesters, polycarbonates, polyimides and similar polymers; polyester films are particularly preferred. The film support can have a thickness in the range from about 10 to about 120 $\mu$m, preferably about 20 to about 80 $\mu$m. In order to improve the dimensional stability, the films generally are biaxially stretched and, if desired, heatset. The surface of the film can be smooth or matted, but smooth films are preferred. In order to improve the adhesion of the photopolymerizable layer (D), the surface of film support (A) may be subjected to a treatment which increases the adhesion, for example by corona discharge, by etching with chemicals, for example trichloroacetic acid, and by coating with an adhesion-promoting primer. Such coatings generally have a thickness of from about 0.001 to about 0.1 $\mu$m. Film support (A) can comprise copolymers of (meth)acrylate esters, as described, for example, in U.S. Pat. No. 4,098,952, and are preferably crosslinked. Suitable films for use in the present invention are described in U.S. Pat. No. 5,049,476. The disclosures of each of these patents are incorporated by reference herein in their entirety.

The photopolymerizable layer (D) can contain any photopolymerizable composition and usually contains, as preferred constituents, a polymeric binder, a polymerizable compound, a photoinitiator and, if desired, further conventional additives. Suitable binders include homopolymers and copolymers of (meth)acrylic esters and in particular polyvinyl acetals, for example polyvinyl butyryl, propional or formal. The proportion of the binder generally is from about 10 to about 75% by weight, and preferably from about 30 to about 70% by weight, based on the non-volatile constituents of the layer.

The polymerizable compound can be any compound capable of polymerizing, and typically includes at least one, preferably at least two, terminal ethylenically unsaturated groups. Particular preference is given to (meth)acrylic esters of polyhydric, in particular, primary aliphatic or cycloaliphatic alcohols. The polymerizable compound should have a boiling point at atmospheric pressure of at least about 100° C. Examples of suitable compounds are acrylates and methacrylates of triethylene glycol, tripropylene glycol, tetraethylene glycol, 1,4-butanediol, 1,6-hexanediol, trimethylol ethane, trimethylol propane, pentaerythritol, dipentaerythritol and of bisphenol A or trimethylolpropane which has been reacted with ethylene oxide or propylene oxide. The polymerizable compound generally is present in the layer in a proportion of from about 10 to about 60% by weight, and preferably from about 15 to about 40% by weight, based on the non-volatile constituents.

The photoinitiator may be any compound that can be stimulated to form free radicals by irradiation with actinic light. Typical examples include polycyclic quinones, acyloins, in particular benzoins, for example benzoin alkyl ethers, α-alkylbenzoins, triarylimidazolyl dimers, quinoxaline compounds and in particular trihalomethyl compounds, in particular trihalomethyl-s-triazines. The photoinitiator generally is present in the photopolymerizable layer in an amount suitable to initiate polymerization, and can be present in an amount of from about 2 to about 30% by weight, and preferably from about 5 to about 20% by weight.

As further constituents, the layer can contain inhibitors for thermal polymerization, spectral sensitizers, plasticizers, oligomers, surface-active compounds, inert fillers, optical brighteners, antihalation agents, photoactivators, hydrogen donors and residual solvents. Those skilled in the art are capable of preparing photopolymerizable layers including the aforementioned components. The photopolymerizable layer generally has a layer weight of from about 0.05 to about 3 g/m$^2$, and preferably from about 0.2 to about 0.5 g/m$^2$.

The colored polymerizable layer (B) can contain any colored polyerizable composition, and usually includes a polymeric binder, a polymerizable compound, a dye or a colored pigment, and, if desired, further conventional additives. The polymerizable compound can be the same as the polymerizable compound utilized in the photopolymerizable layer, or can be another compound selected from the same general group and can be present in the same proportions. Further additives useful in polymerizable layer (B) likewise can be the same as the additives in the photopolymerizable layer. Thus, the colored polymerizable layer can contain inhibitors for thermal polymerization, spectral sensitizers, plasticizers, oligomers, surface-active compounds, inert fillers, optical brighteners, antihalation agents, photoactivators, hydrogen donors and residual solvents.

Suitable polymeric binders useful in layer (B) also can by the same as those utilized in the photopolymerizable layer (D) and, in addition, include styrene-maleic anhydrides, styrene-maleic monoester copolymers, polyamides, polyvinylpyrrolidones, cellulose derivatives, such as cellulose esters and ethers, phenolic resins and polyvinyl esters. Polyvinyl acetals again are preferred in the colored polymerizable layer. The binder generally is present in an amount of from about 10 to about 75%, and preferably from about 20 to about 50% by weight, based on the non-volatile components of the layer.

The dye or the colored pigment can be any dye or pigment capable of forming a color and includes, for example, any dye capable of providing a color. Useful dyes include Permanent Yellow G (C.I. 21 095), Permanent Yellow GR (C.I. 21 100), Permanent Yellow DHG (C.I. 21 090), Permanent Ruby L6B (C.I. 15 850:1), Permanent Pink F3B (C.I. 12 433), Hostaperm Pink E (C.I. 73 915), Hostaperm Red-Violet ER (C.I. 46 500), Permanent Carmine FBB (C.I. 12 485), Hostaperm Blue B2G (C.I. 74 160), Hostaperm Blue A2R (C.I. 74 160) and Printex 25 (carbon black). These pigments or dyes are readily available to those skilled in the art.

The pigments and dyes can, if desired, be blended in order to achieve the desired shade. The pigments generally are dispersed and slurried in a suitable solvent together with some of the binder. The mean particle size of the colored pigment generally is below 1 μm, and preferably below 0.2 μm. Pigments generally are preferred to dyes. The dye or colored pigment usually is present in the layer in an amount sufficient to form a color, and can be any amount of from about 10 to about 50% by weight, and preferably from about 15 to about 35% by weight, based on the non-volatile constituents of the layer. Those skilled in the art are capable of incorporating the aforementioned pigments or dyes in a colored polymerizable layer.

The colored polymerizable layer (B) generally has a layer weight of from about 0.1 to about 5 g/m$^2$, and preferably from about 0.3 to about 1 g/m$^2$. Layer (B) generally is produced by coating and drying using solvents. If the solvents have a low dissolution action, or none at all, with respect to the constituents of the photopolymerizable layer (D), the coating can be applied directly to this layer. Otherwise, the colored polymerizable layer can be applied from a solution to a temporary layer support, dried and transferred to the photopolymerizable layer by lamination. Those skilled in the art readily recognize how to prepare such a colored polymerizable layer (B) in accordance with the procedures outlined herein.

The adhesion layer (C) can be any adhesion layer, and can contain a thermoplastic polymer and, if desired, further constituents. Layer (C) further can have a glass transition temperature ($T_g$) of from about 25° C. to about 100° C. In addition, layer (C) can have the property of becoming tacky on warming to a temperature in the range from about 60° to about 130° C. Layer (C) usually is applied to the colored polymerizable layer (B) from solution or dispersion or by lamination. Suitable solvents which do not partially dissolve layer (B) are saturated hydrocarbons, for example cyclohexane, n-hexane and n-heptane, water or mixtures of water with miscible organic solvents.

Polymers such as (meth)acrylic acid copolymers having a high acid number or vinyl acetate-crotonic acetate copolymers useful in adhesion layer (C) can be applied from aqueous solutions, for example aqueous ammoniacal solutions. Other polymers, for example vinyl acetate polymers, can be applied from aqueous dispersions. Still other polymers, for example ethylene- vinyl acetate copolymers, can be applied from the melt. The adhesion layer also can be applied to the colored polymerizable layer (B) by preparing it on a temporary layer support and transferring it therefrom to the colored polymerizable layer by lamination and peeling off of the temporary support.

The adhesion layer also can be transferred from the temporary support to the image-receiving sheet (E) by lamination and peeling off. The photopolymerizable material comprising film support (A), uncolored photopolymerizable layer (D) and colored polymerizable layer (B) then is laminated with the latter onto the adhesion layer on the image-receiving sheet. For this type of transfer, (meth)acrylic ester polymers and in particular vinyl acetate polymers having a softening range of from 80° to 180° C. are suitable. Those skilled in the art are capable of applying addition layer (C) depending on the thermoplastic polymer of layer (C) and the constituents of layer (B).

The thermoplastic polymer present in adhesion layer (C) preferably is present in the adhesion layer in a proportion of greater than about 50% by weight. The polymer generally has a softening temperature in the range from about 40° to about 200° C., in particular from about 60° to about 120° C.. In addition, the adhesion layer may contain UV absorbers, antistatic additives, inert fillers, optical brighteners, additives for increasing the tack, and plasticizers. Suitable adhesion layers useful in the present invention are described in U.S. Pat. No. 5,049,476 and the earlier unpublished German Patent Applications P 42 04 950.4 and P 42 43 253.7, the disclosures of which are incorporated by reference herein in their entirety. The adhesion layer generally has a thickness of greater than about 1 µm, and it typically has a layer weight of from about 2 to about 30 g/m$^2$, preferably from about 4 to about 12 g/m$^2$. Those skilled in the art are capable of preparing adhesion layer (C) in accordance with the guidelines presented herein.

The image-receiving sheet (E) can comprise any suitable material which withstands the conditions of lamination and peeling apart and which forms a suitable visual contrast to the transferred color image. The material should normally be white. Plastic films, for example pigmented polyester films, plastic-coated papers, for example polyethylene-coated paper, wood, glass, metal and the like can be used. The material also can carry an adhesion-promoting precoating. A normal printing paper also can be employed.

Lamination ordinarily is carried out by placing the photopolymerizable material with its adhesion layer onto the receiving sheet and passing it together with the latter through the nip between two heated lamination rolls under a sufficient pressure. The lamination temperature is usually in the range from about 60° about 130° C., preferably from about 70° to about 110° C. The rolls can have the same or different temperatures; the lamination rate usually is between about 10 and about 100 cm/min, preferably from about 20 to about 60 cm/min. Preparing an image receiving sheet (E) and laminating layers thereon is within the skill of those skilled in the art.

The photopolymerizable layer is exposed in a known manner through the transparent film support (A) before or after the lamination. The exposure usually is carried out under a positive screen separation in a vacuum copying frame. Preferred light sources are mercury vapor lamps. Any light source capable of framing an image, however, is suitable for use in the present invention. Light absorption filters also can be employed to reduce scattered light.

After the lamination and exposure, the image is developed at room temperature by evenly peeling off the film support from the receiving sheet. Special devices for gripping or holding the receiving sheet down during the peeling operation are unnecessary since only moderate peeling forces are required. The peel angle should be at least 90°. During the peeling, the entire uncolored photopolymerizable layer (D) is removed with the film support together with the exposed areas of the colored polymerizable layer, and the unexposed areas of the colored polymerizable layer remain on the image-receiving sheet together with the entire adhesion layer. A positive image of the original is thus obtained.

An additional photopolymerizable material including a polymerizable layer having a different color then can be laminated onto the first single-color image by means of an adhesion layer and exposed through the corresponding color separation in register with the first single-color image. The second single-color image is developed in the same way by peeling off the film support. A third and fourth single-color image further can be added in the same way. A four-color image usually is built up from the primary colors cyan, magenta, yellow and black. If desired, the surface of the finished image can be given a matt texture, for example by embossing the glossy surface in contact with a rough surface, for example a matted film. To this end, the image and the matted film are passed together through the nip between the rolls of a lamination unit. Selection of an appropriate matted material allows the surface texture to be determined.

Finally, the finished image can be cured by final exposure with a suitable light source, if necessary with warming. A protective layer, as described, for example, in U.S. Pat. No. 4,999,266, also can be laminated onto the surface of the finished image. Preparing a multicolored image using photopolymerizable materials of the present invention is within the skill of the skilled in the art upon reading the guidelines presented herein.

The examples below illustrate preferred embodiments of the invention. The amounts are expressed in parts by weight (pbw). Ratios and percentages are expressed in weight units, unless stated otherwise.

EXAMPLE 1

A solution combining the following ingredients was applied to one side of a biaxially stretched and heat-set polyethylene terephthalate film 18.8 pbw of polyvinyl formal, mean molecular weight 110,000, 7% of vinyl alcohol units, 11% of vinyl acetate units and 82% of vinyl formal units (®Formvar 15/95), 11.3 pbw of dipentaerythritol pentaacrylate and 5.6 pbw of 2-(4-styrylphenyl)-4,6-bis-trichloromethyl-s-triazin in 1,500 pbw of tetrahydrofuran and 450 pbw of 1-methoxy-2-propanol.

The polyethylene terephthalate film had a thickness of 50 µm, and the side of the polyethylene terephthalate film treated with the aforementioned solution was initially coated with an adhesive promoter in accordance with U.S. Pat. No. 4,391,767, the disclosure of which is incorporated in its entirety herein. The other side of the film was provided with an antiblocking finish. After drying for two minutes at 70° C., the photopolymerizable layer had a weight of 0.3 g/m².

Four samples of the film prepared above and provided with the photopolymerizable layer were coated with, in each case, one of the following coating solutions for the primary colors cyan, yellow, magenta and black:

|  | Cyan pbw | Yellow pbw | Magenta pbw | Black pbw |
|---|---|---|---|---|
| Dipentaerythritol-pentaacrylate | 3.60 | 3.09 | 3.03 | 3.02 |
| Polyvinyl formal mean molecular weight 80,000, 24% of vinyl alcohol units, 26% of vinyl acetate units and 50% of vinyl formal units (®Formvar 12/85) | 2.86 | 2.87 | 3.01 | 2.42 |
| ®Hostaperm Blue B2G (C.I. 74 160) | 1.75 | — | — | — |
| Permanent Yellow GR (C.I. 21 100) | — | 1.33 | — | — |
| Permanent Carmine FBB (C.I. 12 485) | — | — | 1.58 | — |
| Carbon black (®Printex 25) | — | — | — | 2.07 |
| Tetrahydrofuran | 93.00 | 79.95 | 78.28 | 78.05 |
| 1-Methoxy-2-propanol | 63.00 | 54.16 | 53.03 | 52.87 |
| γ-Butyrolactone | 12.62 | 11.77 | 14.10 | 15.12 |

The aforementioned colored pigments were introduced into the solutions as dispersions. To this end, they were dispersed in butyrolactone together with some of the polyvinyl formal and ground to the desired particle size, i.e. a mean particle diameter of 0.1 μm. Before the coating, each coating solution was mixed well. The coatings then were dried for two minutes at 70° C., and the optical densities of the individual layers were measured to yield the following values:

| Cyan | 1.3 |
|---|---|
| Yellow | 1.0 |
| Magenta | 1.4 |
| Black | 1.6 |

Each of the colored polymerizable layer weights were 0.6 g/m². Each of the colored layers was coated with an adhesion layer solution of the following composition:

|  | pbw |
|---|---|
| Ammonium hydroxide (25%) | 8.5 |
| Sodium sulfite | 1.4 |
| Polyvinyl methyl ether (®Lutonal M 40) | 1.9 |
| Pyrogenic silicic acid, mean particle size 3 μm | 0.1 |
| Vinyl acetate-crotonic acid copolymer (95:5) | 96.7 |
| Water | 520.0 |
| Ethanol | 43.0 |

After drying, the adhesion layers each had a weight of 6.5 g/m². The cyan film was laminated by means of its adhesion layer onto a paper receiving sheet at 105° C. The photosensitive material then was exposed for 3 seconds through the film support by means of a 5,000 W copying lamp under a cyan positive color separation. After the exposure, the film support was peeled off from the receiving sheet, and the exposed areas of the color layer adhered to the film support and the unexposed areas remained on the receiving sheet together with the entire adhesion layer.

The yellow photosensitive color film was laminated onto the cyan single-color image in the same manner in which the cyan color film was laminated to the image receiving sheet, and then exposed under the corresponding yellow color separation and developed to form a yellow single-color image by peeling off the film support. These process steps then were repeated in a corresponding manner with the magenta and black color films. An accurate four-color reproduction of the original was obtained.

The dot reproduction of the resulting film was from at least 3 to 99% in a screen of 60 lines per cm. The yellow coloration in the non-image areas, measured using a blue filter, corresponded to an optical density of 0.01; after further exposure for 30 seconds and peeling-off the film support, it increased to 0.02.

EXAMPLES 2 TO 8

A cyan film was produced as described in Example 1, but with different photoinitiators in the photosensitive layer. The table below illustrates the photoinitiators, their color, their absorption maximum, the exposure time and the background discoloration before and after subsequent exposure.

| Example | Initiator | $\lambda_{max}$ (nm) | Exposure time (s) | Discoloration before subsequent exposure | after subsequent exposure |
|---|---|---|---|---|---|
| 1 | as Example 1 | 371 | 3 | 0.01 | 0.02 |
| 2 | 2-(4-ethoxynaphth-1-yl)-4,6-bistrichloromethyl-s-triazine | 388 | 5 | 0.01 | 0.02 |
| 3 | 2-(4-methoxystyryl)-4,6-bistrichloromethyl-s-triazine | 379 | 6 | 0.01 | 0.02 |
| 4 | Michler's ketone | 366 | 60 | 0.01 | 0.02 |
| 5 | 2-(3,4-dimethoxyphenyl)-4,6-bistrichloromethyl-s-triazine | 352 | 20 | 0.01 | 0.02 |
| 6 | 2-(3,4,5-trimethoxy-phenyl)-4,6-bistrichloro-methyl-s-triazine | 337 | 70 | 0.01 | 0.02 |
| 7 | 2-biphenyl-4-yl-4,6-bis-trichloromethyl-s-triazine | 332 | 25 | 0.00 | 0.01 |
| 8 | 4,4'-bis[2,4-bistri-chloromethyl-6-triazinyl]-diphenyl ether | 331 | 30 | 0.00 | 0.01 |

EXAMPLE 9

The method of example 1 was carried out except that the amount of monomer in the photopolymerizable layer of the cyan film was doubled, i.e. increased to 22.6 pbw. The exposure time was 3 seconds. The dot reproduction was is changed to 2-98%. The background discoloration of the four-color image for yellow was 0.02 density unit, after subsequent exposure, 0.04 density unit.

EXAMPLE 10

Example 1 was repeated with the difference that the monomer in the photopolymerizable layer of the cyan film was replaced by the same amount of trimethylolpropane triacrylate. The exposure time was 5 seconds. The background discoloration of the four-color image toward yellow corresponded to 0.02 density unit, after subsequent exposure, 0.03 density unit.

EXAMPLE 11

Example 1 was repeated with the difference that the binder in the photopolymerizable layer was replaced by the same amount of an ethyl methacrylate polymer (to give viscosity in 37.5% strength solution in toluene 7,500 mPa.s., acid number 0, Tg 63° C). The exposure time was 5 seconds. The background discoloration of the four-color image toward yellow corresponded to 0.01 density unit, after subsequent exposure 0.02 density unit. The dot reproduction was 4–97%.

COMPARATIVE EXAMPLE A

The procedure of this comparative example was similar to that in Example 1, but the photopolymerizable layer and the color layer are combined to form a single layer. The coating solutions for the four base films had the following composition:

| | Cyan pbw | Yellow pbw | Magenta pbw | Black pbw |
|---|---|---|---|---|
| Dipentaerythritol pentaacrylate | 3.90 | 3.82 | 3.55 | 3.61 |
| Formvar 12/85 | 3.13 | 3.54 | 3.65 | 2.89 |
| s-Triazine derivative as Example 1 | 0.98 | 0.95 | 0.78 | 0.96 |
| Hostaperm Blue B2G | 1.90 | — | — | — |
| Permanent Yellow GR | — | 1.64 | — | — |
| Permanent Carmine FBB | — | — | 1.85 | — |
| Printex 25 | — | — | — | 2.48 |
| Tetrahydrofuran | 100.00 | 100.00 | 100.00 | 100.00 |
| 1-Methoxy-2-propanol | 68.00 | 68.00 | 68.00 | 68.00 |
| γ-Butyrolactone | 19.00 | 19.00 | 19.00 | 19.00 |

The photopolymerizable color layers were produced in the same manner as described in Example 1. The optical densities and layer weights were the same as given therein. The color layers were each coated with an identical adhesion layer as in Example 1.

The color films were processed in the same manner as described in Example 1 to give a multicolored image. The dot reproduction was from 2 to 98%, and the exposure time was from 3 to 6 seconds, depending on the color. The yellow background discoloration was 0.04 density unit, due in part to the presence of the yellow photoinitiator in the color layer. After subsequent exposure for 30 seconds, this value increased to 0.06 and was thus no longer tolerable.

COMPARATIVE EXAMPLE B

Comparative Example A was repeated but with the s-triazine employed as photoinitiator replaced by the same amount of the white compound 2-biphenyl-4-yl-4,6-bistrichloromethyl-s-triazine. The dot reproduction ranged from 2 to 98%, but exposure times of from 14 to 28 seconds were necessary. The yellow background discoloration was 0.03 unit; after subsequent exposure, it increased to 0.09 unit.

EXAMPLE 12

As in Example 1, 4 photosensitive color films were produced by means of the following coating solution:

| | Cyan pbw | Yellow pbw | Magenta pbw | Black pbw |
|---|---|---|---|---|
| Dipentaerythritol pentaacrylate | 3.60 | 3.09 | 3.03 | 3.02 |
| Formvar 12/85 | 2.86 | 2.87 | 3.01 | 2.42 |
| Hostaperm Blue B2G | 1.75 | — | — | — |
| Permanent Yellow GR | — | 1.33 | — | — |
| Permanent Carmine FBB | — | — | 1.58 | — |
| Printex 25 | — | — | — | 2.07 |
| Butanone | 39.00 | 33.53 | 32.83 | 32.73 |
| 1-Methoxy-2-propanol | 87.75 | 75.44 | 73.86 | 73.64 |
| 4-Hydroxy-4-methyl-2-pentanone | 29.25 | 25.15 | 24.62 | 24.54 |
| γ-Butyrolactone | 12.62 | 11.77 | 14.10 | 15.12 |

The color films were processed as in Example 1, giving essentially the same results. The solvent mixture employed in this example was preferred since the 4-hydroxy-4-methyl-2-pentanone present therein does not dissolve the polyvinyl formal present as binder in the photopolymerizable precoating. Since the 1-methoxy-2-propanol does not dissolve any of the polyvinyl formals used, less care need be taken to ensure that the precoating is not dissolved.

The invention has been described by reference to the following detailed description and examples illustrating preferred embodiments. Those skilled in the art recognize, however, that various modifications can be made to the foregoing description when departing from the spirit and scope of the claimed invention.

What is claimed is:

1. A photopolymerizable material comprising
   (A) a flexible, transparent film support;
   (B) a colored, polymerizable layer containing an organic binder, a free-radical-polymerizable compound, containing at least one terminal ethylenically unsaturated group, and a dye or colored pigment; and
   (C) an adhesion layer containing a thermoplastic polymer, said adhesion layer having a $T_g$ of from 25° to 100° C.; and
   (D) an uncolored photopolymerizable layer containing a polymeric organic binder, a free-radical-polymerizable compound containing at least one terminal ethylenically unsaturated group, and a photopolymerizable initiator, said layer being disposed between the film support (A) and the colored polymerizable layer (B),
   wherein the cohesion of layers (B), (C) and (D) and the adhesion of these layers to one another and to the film support (A) provide the relationships wherein the adhesion ($a_2$) of the photopolymerizable layer (D) to the colored layer (B) in the unexposed state is lower than: (i) the adhesion ($a_3$) of the colored layer (B) to the adhesion layer (C); (ii) the adhesion ($a_1$) of the photopolymerizable layer (D) to the film support A) and (iii) the cohesions ($c_1$), ($c_2$) and ($c_3$) of layers (D), (B) and (C);
   and wherein the adhesion ($a_3'$) of the colored layer (B) to the adhesion layer (C) in the exposed state is lower than: (i) the adhesion ($a_1'$) of the photopolymerized layer (D) to the film support (A); (ii) the adhesion (a$_2$') of the photopolymerized layer (D) to the colored layer (B); and (iii) the cohesions (c$_1$'), (c$_2$') and (c$_3$') of layers (D), (B) and (C).

2. A photopolymerizable material as claimed in claim 1, wherein the colored polymerizable layer (B) is not photosensitive.

3. A photopolymerizable material as claimed in claim 1, wherein the surface of the film support (A), on which the uncolored layer (D) is located, is pretreated in order to increase its adhesion.

4. A photopolymerizable material as claimed in claim 3, wherein the surface has been pretreated by coating with an acrylic or methacrylic ester polymer.

5. A photopolymerizable material as claimed in claim 1, wherein the free-radical-polymerizable compound of either layer (B) or (D) or both contains at least two terminal ethylenically unsaturated groups.

6. A photopolymerizable material as claimed in claim 1, wherein the uncolored photopolymerizable layer (D) has a weight within the range of from 0.05 to 3 g/m$^2$.

7. A photopolymerizable material as claimed in claim 1, wherein the colored polymerizable layer (B) has a weight within the range of from 0.1 to 5 g/m$^2$.

8. A photopolymerizable material as claimed in claim 1, wherein the adhesion layer (C) has a weight within the range of from 2 to 30 g/m$^2$.

9. A photopolymerizable material as claimed in claim 1, wherein the colored polymerizable layer (B) is thicker than the uncolored photopolymerizable layer (D).

10. A process for the producing a colored image which comprises:
   (a) laminating a photopolymerizable material as claimed in claim 1 with its adhesion layer (C) to an image-receiving sheet (E) under pressure and at elevated temperature;
   (b) exposing the resultant laminate image-wise through the film support (A); and
   (c) peeling the film support, together witch the photopolymerizable layer (D) and the exposed areas of the colored polymerizable layer (B), off from the image-receiving sheet,
wherein the adhesion (a$_4$) of the adhesion layer (C) to the image-receiving sheet (E) in the unexposed state is greater than the adhesion (a$_2$) of the photopolymerizable layer (D) to the colored layer (B), and the adhesion (a$_4$') of the adhesion layer (C) to the image-receiving sheet (E) in the exposed state is greater than the adhesion (a$_3$') of the colored polymerizable layer (B) to the adhesion layer (C).

11. A process as claimed in claim 10, wherein a single-color image is produced by employing a photopolymerizable material whose colored polymerizable layer (B) has been colored in a primary color of a multicolor print, and the exposure is carried out under a color separation for the same primary color.

12. A process as claimed in claim 11, wherein a photopolymerizable material of a second primary color is laminated onto the first single-color image, and the exposure is carried out in register with the first single-color image but using a color separation for the second primary color, and the same steps are optionally repeated with at least one further primary color.

13. A process as claimed in claim 10, wherein the photopolymerizable material is laminated onto the receiving sheet in step (a) at a temperature in the range of from 60° to 130° C.

14. A process as claimed in claim 10, wherein the colored image on the image-receiving material is covered with a protective coating.

15. A process as claimed in claim 10, wherein the colored image obtained on the image-receiving sheet after the film support has been peeled off is cured by exposure without a mask.

16. A process as claimed in claim 10, wherein the free-radical-polymerizable compound of either layer (B) or (D) or both contains at least two terminal ethylenically unsaturated groups.

17. A process as claimed in claim 10, wherein the uncolored photopolymerizable layer (D) has a weight within the range of from 0.05 to 3 g/m$^2$.

18. A process as claimed in claim 10, wherein the colored polymerizable layer (B) has a weight within the range of from 0.1 to 5 g/m$^2$.

19. A process as claimed in claim 10, wherein the adhesion layer (C) has a weight within the range of from 2 to 30 g/m$^2$.

20. A process as claimed in claim 10, wherein the colored polymerizable layer (B) is thicker than the uncolored photopolymerizable layer (D).

* * * * *